(12) United States Patent
Hegde

(10) Patent No.: US 10,763,115 B2
(45) Date of Patent: Sep. 1, 2020

(54) SUBSTRATE TREATMENT METHOD FOR SEMICONDUCTOR DEVICE FABRICATION

(71) Applicant: NXP USA, INC., Austin, TX (US)

(72) Inventor: Rama I. Hegde, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/624,843

(22) Filed: Jun. 16, 2017

(65) Prior Publication Data
US 2018/0366330 A1    Dec. 20, 2018

(51) Int. Cl.
| | | |
|---|---|---|
| *H01L 21/00* | (2006.01) | |
| *H01L 21/28* | (2006.01) | |
| *H01L 29/66* | (2006.01) | |
| *H01L 21/285* | (2006.01) | |
| *H01L 21/02* | (2006.01) | |
| *H01L 29/49* | (2006.01) | |
| *H01L 29/51* | (2006.01) | |
| *B81C 1/00* | (2006.01) | |
| *H01L 21/768* | (2006.01) | |

(52) U.S. Cl.
CPC .... *H01L 21/28255* (2013.01); *B81C 1/00238* (2013.01); *H01L 21/02181* (2013.01); *H01L 21/02244* (2013.01); *H01L 21/02255* (2013.01); *H01L 21/28229* (2013.01); *H01L 21/28562* (2013.01); *H01L 29/495* (2013.01); *H01L 29/517* (2013.01); *H01L 29/6656* (2013.01); *B81C 2203/035* (2013.01); *H01L 21/76898* (2013.01)

(58) Field of Classification Search
CPC ............... H01L 21/28255; H01L 21/02181
USPC ................................................ 438/591
See application file for complete search history.

(56) References Cited

U.S. PATENT DOCUMENTS

| | | | |
|---|---|---|---|
| 7,132,372 B2 | 11/2006 | Smith et al. | |
| 7,238,291 B2 | 7/2007 | Onsia et al. | |
| 8,632,691 B2 | 1/2014 | Huang et al. | |
| 8,691,636 B2 | 4/2014 | Liu et al. | |
| 9,911,746 B1* | 3/2018 | Ramkumar | H01L 27/11568 |
| 2005/0196933 A1* | 9/2005 | Nunan | G01P 15/0802 438/400 |
| 2006/0110899 A1* | 5/2006 | Bourdelle | H01L 21/76254 438/584 |
| 2006/0170017 A1 | 8/2006 | Muraoka | |
| 2007/0069401 A1* | 3/2007 | Kakehata | C23C 8/36 438/785 |

(Continued)

OTHER PUBLICATIONS

Rangan, S., "GeO$_x$ interface later reduction upon Al-gate deposition on a HfO$_2$ /GeO$_x$/ Ge(001) stack", Rutgers University, Department of Physics and Astronomy and Laboratory for Surface Modification, Mar. 6, 2008.

(Continued)

*Primary Examiner* — Mohammad M Choudhry

(57) ABSTRACT

A method of removing an oxide layer is provided. A metal layer is deposited over an oxide layer formed at a top surface of a germanium substrate. A metal oxide layer is deposited over the metal layer. The metal oxide layer includes a same metal material as the metal layer. The metal layer and the oxide layer are reacted and combined with the metal oxide layer to form a dielectric layer during an anneal process. During the anneal process, the oxide layer is reacted with the metal layer and removed.

19 Claims, 5 Drawing Sheets

(56) References Cited

U.S. PATENT DOCUMENTS

| | | | |
|---|---|---|---|
| 2007/0170541 A1* | 7/2007 | Chui | H01L 21/28255 257/506 |
| 2009/0108294 A1* | 4/2009 | Choi | H01L 21/28088 257/190 |
| 2010/0099245 A1* | 4/2010 | Hyun | H01L 21/82345 438/585 |
| 2010/0109095 A1* | 5/2010 | Li | H01L 21/28229 257/392 |
| 2010/0237444 A1* | 9/2010 | Lin | H01L 21/02175 257/411 |
| 2014/0179095 A1 | 6/2014 | Niyogi et al. | |
| 2015/0093887 A1 | 4/2015 | Yang et al. | |
| 2015/0311178 A1 | 10/2015 | Shin et al. | |
| 2015/0380309 A1 | 12/2015 | Mujumdar et al. | |

OTHER PUBLICATIONS

Zhang, R., "High-Mobility Ge pMOSFET With 1-nm EOT $Al_2O_3$/ $GeO_x$ / Ge Gate Stack Fabricated by Plasma Post Oxidation", 2011 IEEE.

\* cited by examiner

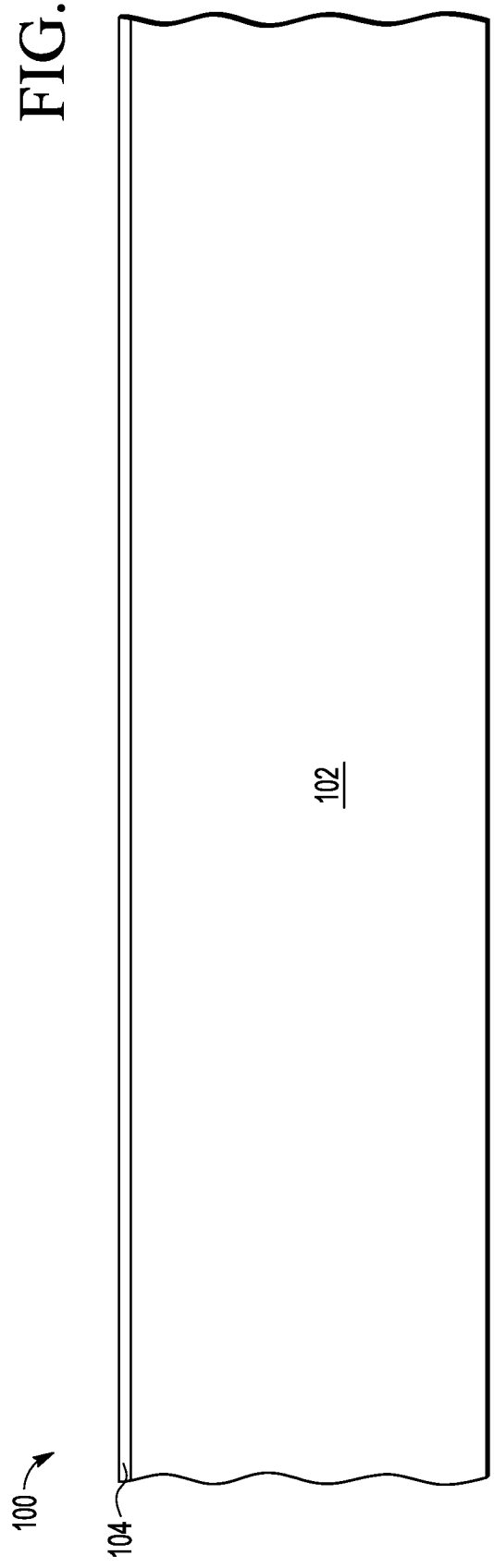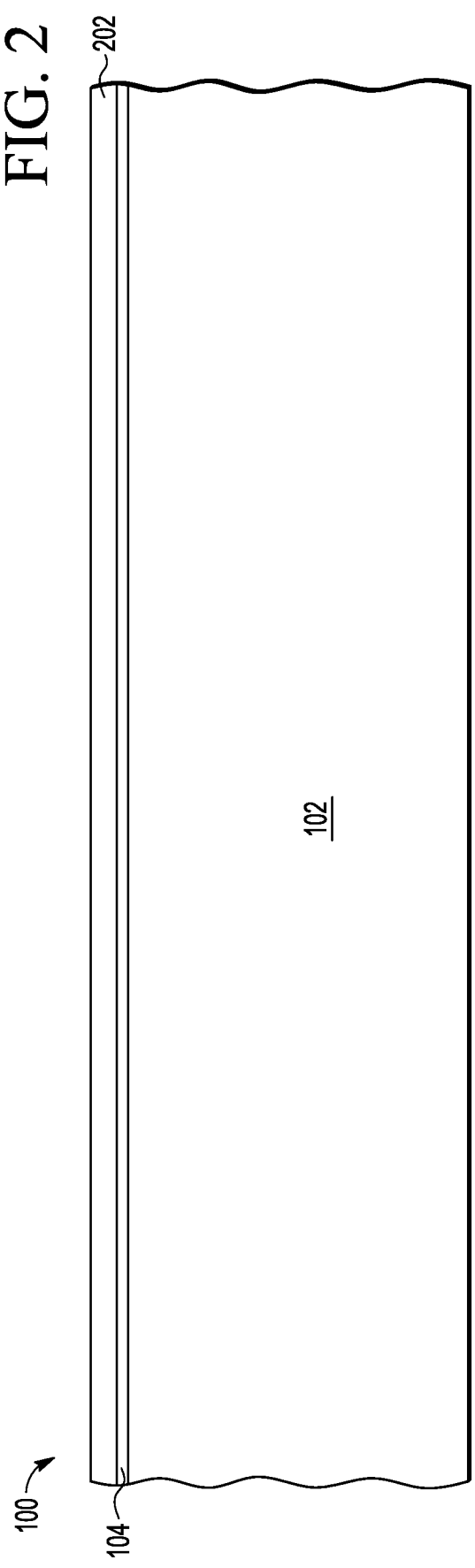

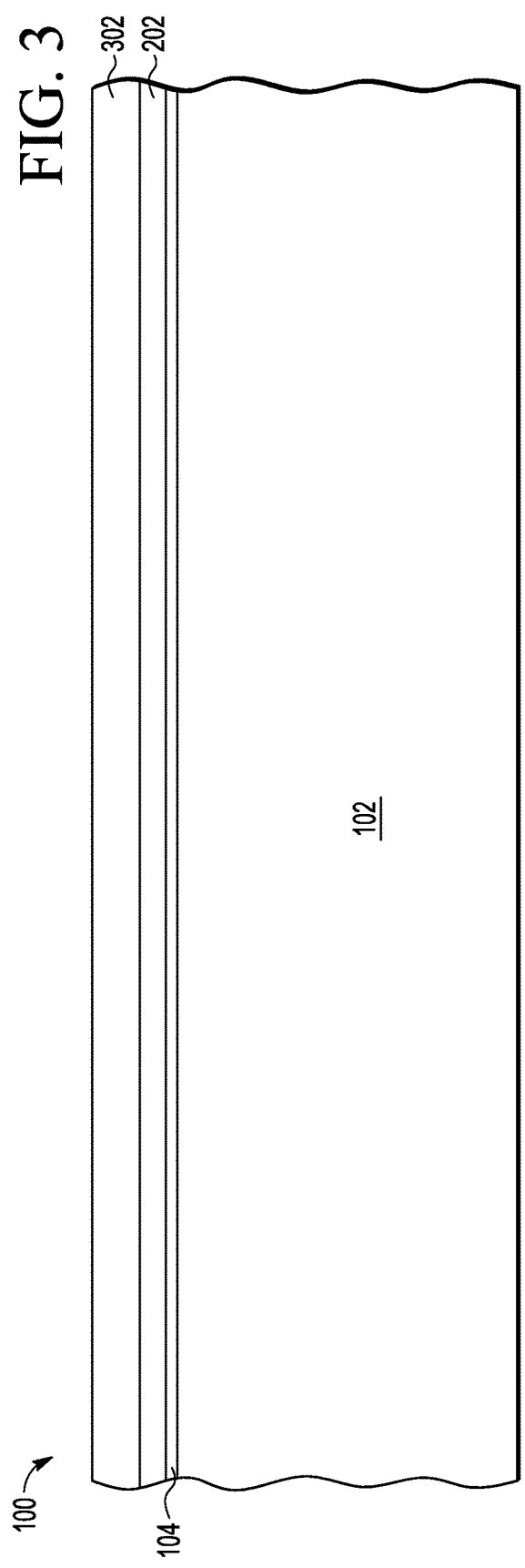
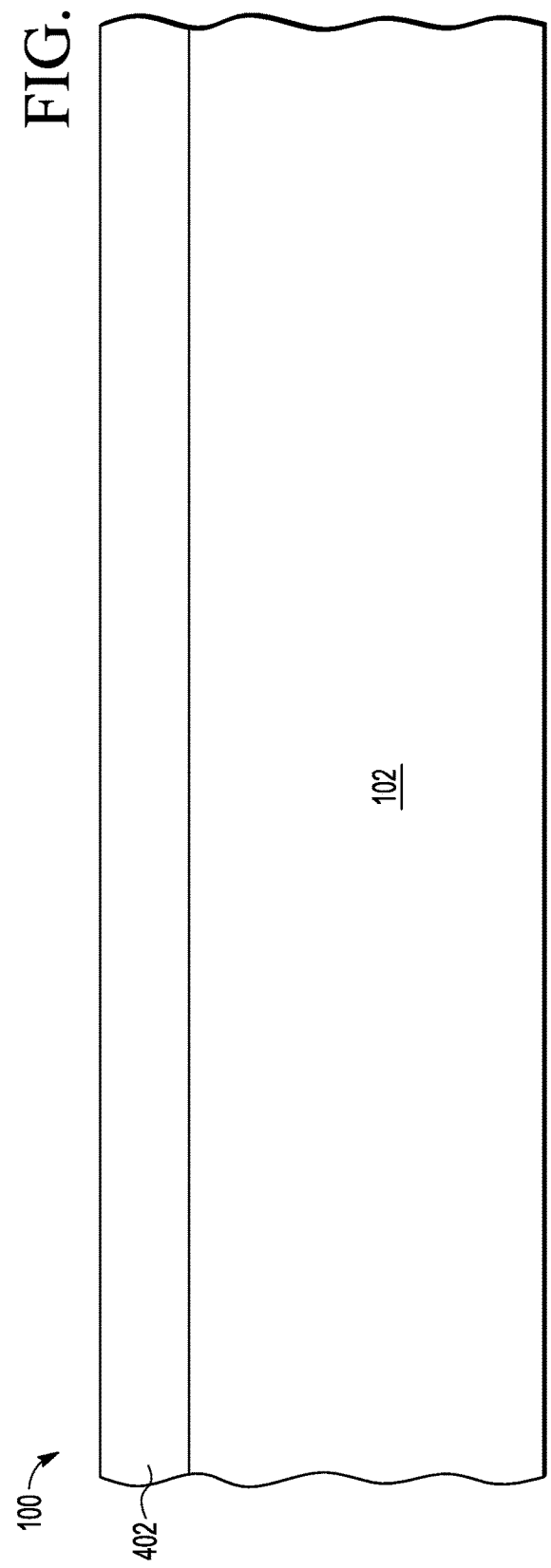

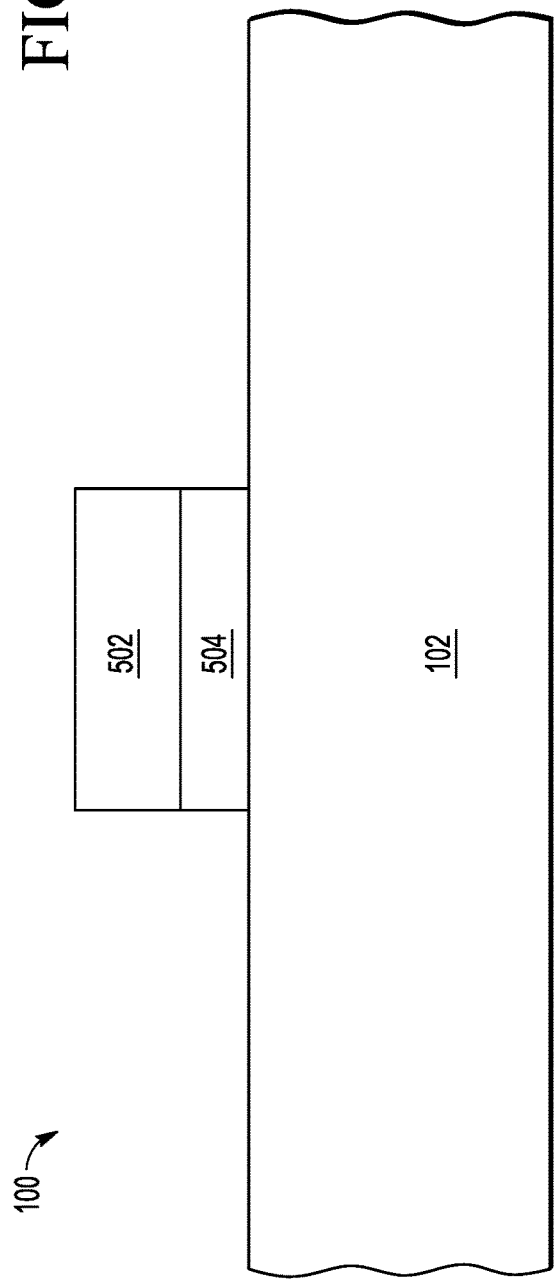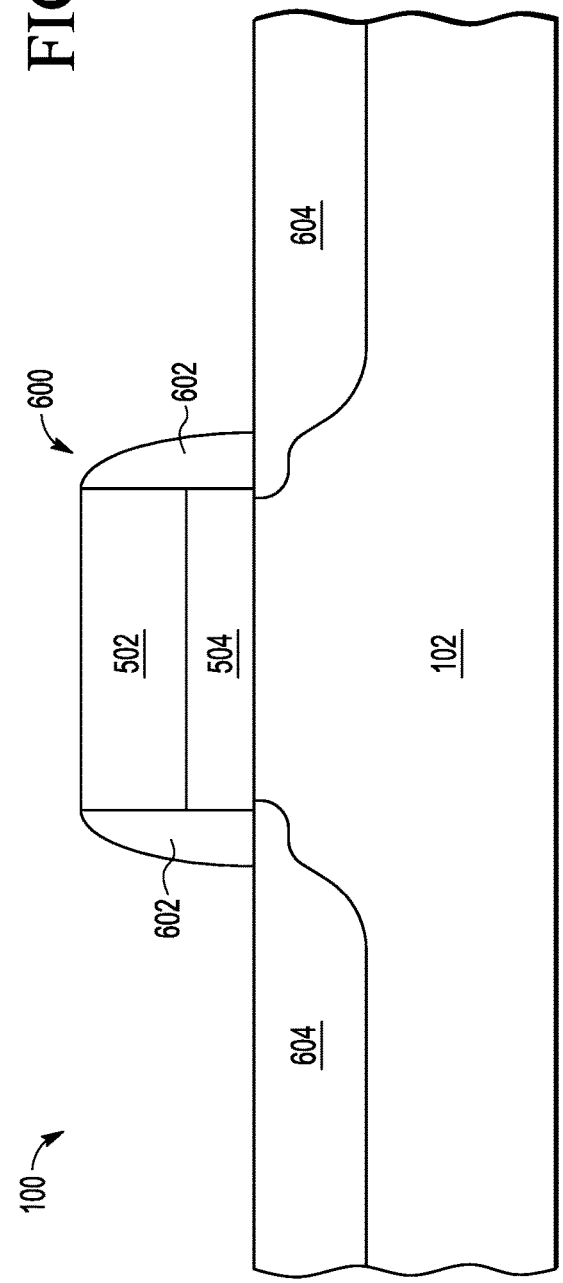

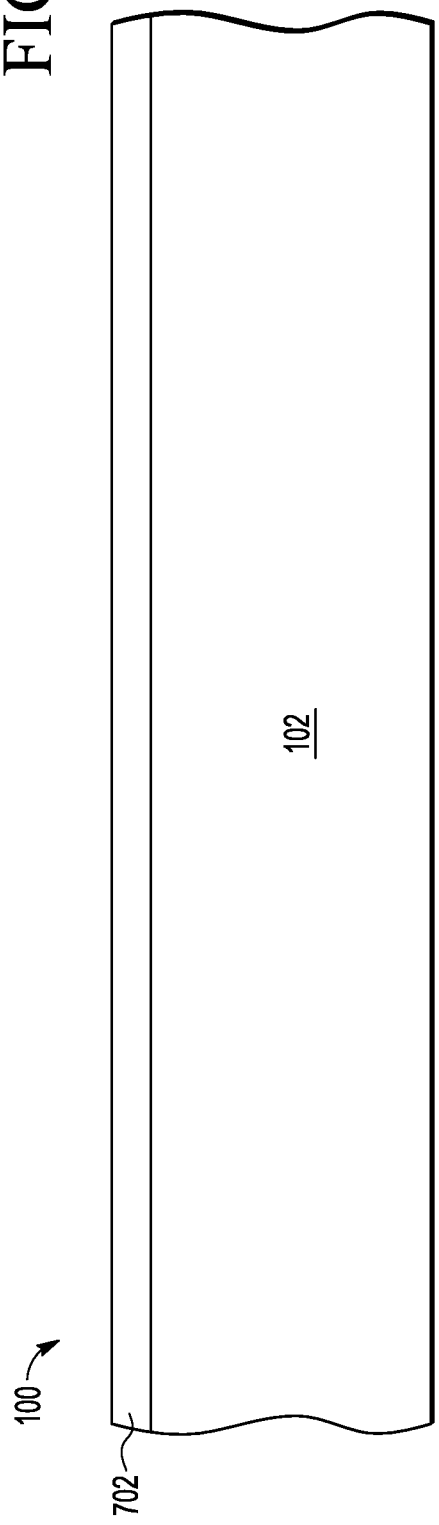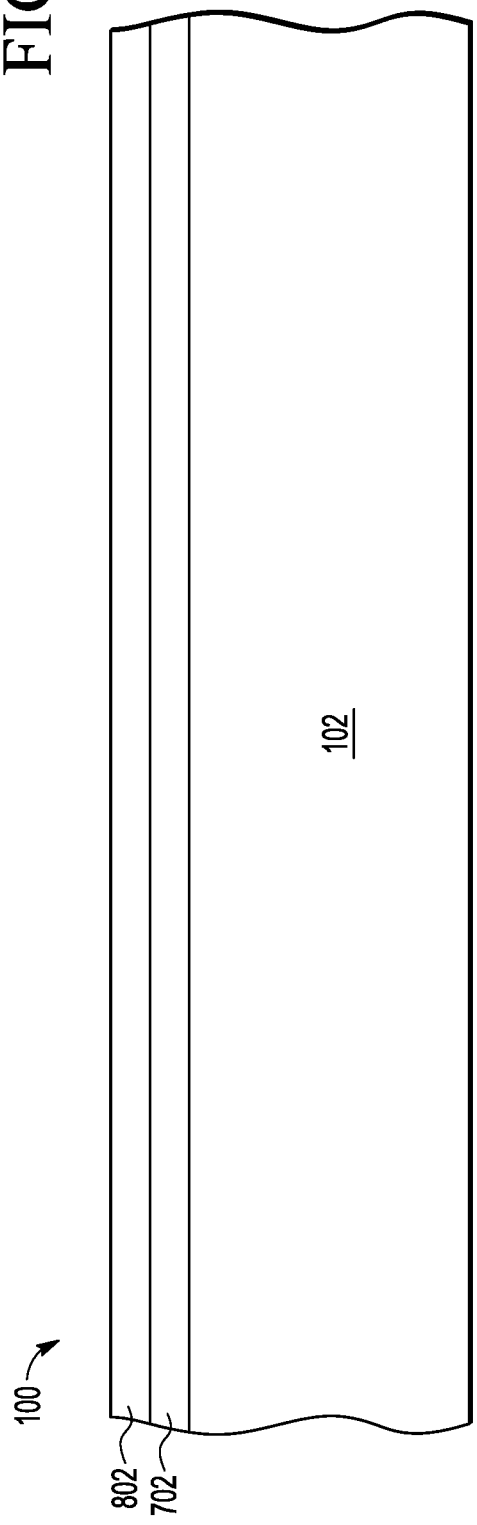

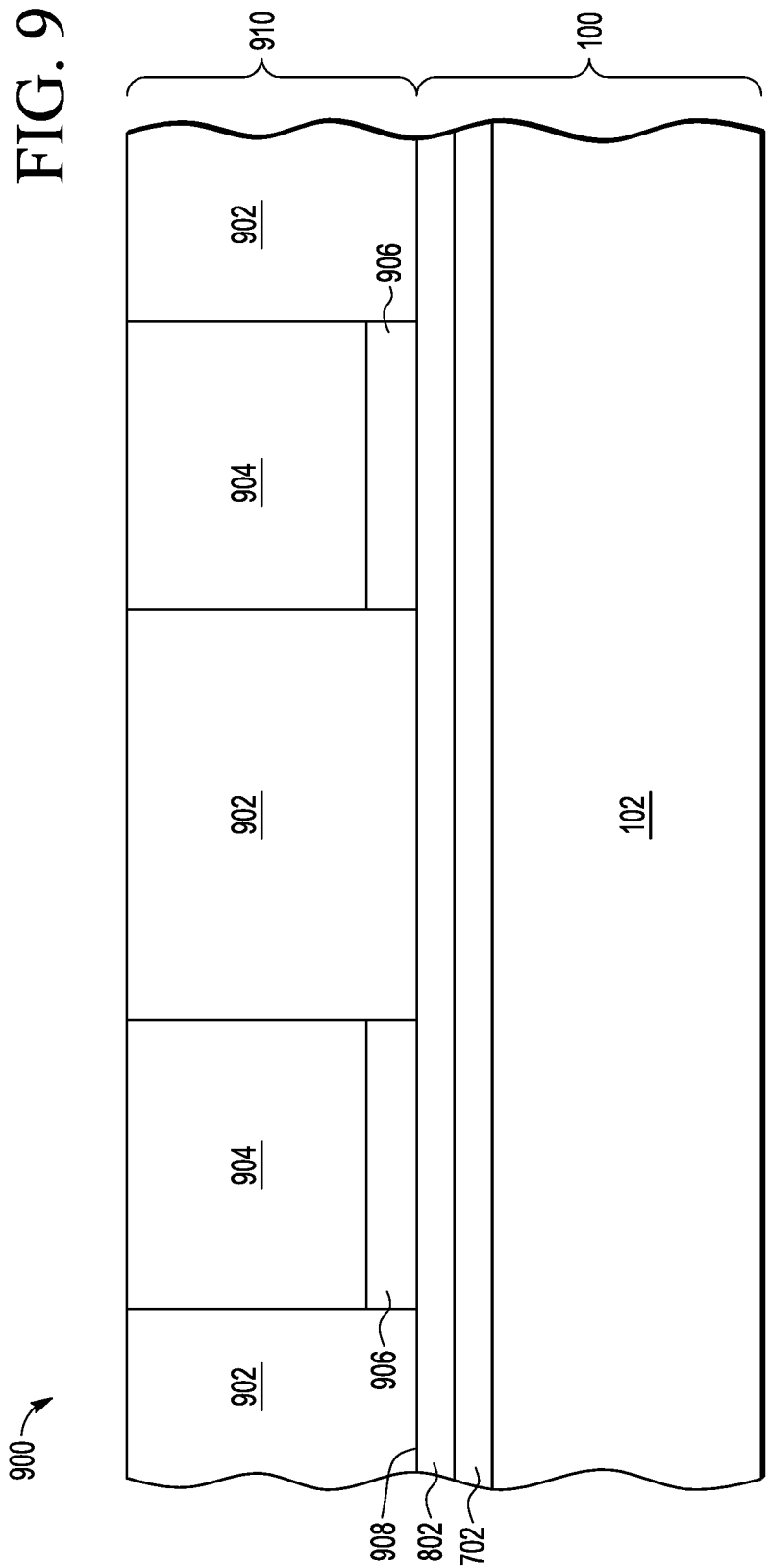

US 10,763,115 B2

SUBSTRATE TREATMENT METHOD FOR SEMICONDUCTOR DEVICE FABRICATION

BACKGROUND

Field

This disclosure relates generally to semiconductor device fabrication, and more specifically, to substrate treatment method for semiconductor device fabrication.

Related Art

Semiconductor devices are often found in a large spectrum of electronic products—from sewing machines to washing machines, from automobiles to cellular telephones, and so on. As technology progresses, these semiconductor devices are expected to reduce in size and cost while increasing performance. However, it is unlikely that traditional silicon (Si) based complementary metal oxide semiconductor (CMOS) technology can continue to drive semiconductor device performance without reaching limits. In pursuit of more advanced semiconductor device performance, germanium (Ge) based CMOS has been gaining favorable attention. One aspect of germanium based CMOS semiconductor devices is the increased mobility of electrons and holes over silicon based CMOS devices. The increased mobility can allow germanium based CMOS to continue advancement of semiconductor device performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIGS. 1-6 illustrate, in simplified cross-sectional views, various stages of manufacture of an exemplary semiconductor device formed in accordance with an embodiment of the present invention.

FIGS. 7-8 illustrate, in simplified cross-sectional view, stages of manufacture of exemplary semiconductor device formed in accordance with another embodiment of the present invention.

FIG. 9 illustrates, in simplified cross-sectional view, an exemplary sensor device at a stage of manufacture formed in accordance with an embodiment of the present invention.

DETAILED DESCRIPTION

Generally, there is provided, a method of forming a structure on a germanium (Ge) substrate to remove a germanium oxide layer. By depositing a thin metal layer over a germanium oxide layer at a top surface of a germanium substrate followed by an anneal process, a metal oxide can be formed during the anneal process. The metal oxide formation effectively removes the germanium oxide layer and provides a quality interface layer at the surface of the germanium substrate. With the formation of the metal oxide, a subsequent deposition of a like metal oxide can be used to form a high-K dielectric. Likewise, after formation of the metal oxide, a subsequent deposition of a like metal can be used to form an adhesion layer at a die-on-die interface.

FIGS. 1-6 illustrate, in simplified cross-sectional views, various stages of manufacture of an exemplary semiconductor device formed in accordance with an embodiment of the present disclosure.

FIG. 1 illustrates in a simplified cross-sectional view, exemplary semiconductor device 100 at a stage of manufacture in accordance with an embodiment of the present invention. At this stage of manufacture, exemplary semiconductor device 100 includes a substrate 102 having a germanium oxide ($GeO_x$, where $0 \leq x \leq 2$) layer 104 formed at a top surface of the substrate. The substrate 102 may be referred to as a germanium (Ge) substrate 102 being formed from a germanium material, a substrate having a germanium film formed at a top surface of the substrate, a germanium material deposited on a silicon-based substrate to have a germanium rich surface (90% or greater germanium concentration), or the like. The germanium oxide layer 104 may be characterized as a native or natural oxide formed from exposing the germanium substrate 102 to air or other environmental conditions conducive to oxide formation.

FIG. 2 illustrates in a simplified cross-sectional view, exemplary semiconductor device 100 at a subsequent stage of manufacture in accordance with an embodiment of the present invention. A thin metal layer 202 is deposited directly over and in contact with the germanium oxide layer 104. Thin metal layer 202 may include any suitable metal such as aluminum (Al), hafnium (Hf), zirconium (Zr), titanium (Ti), tantalum (Ta), lanthanum (La), yttrium (Y), and the like, and may be deposited using any suitable process. For example, in this embodiment the thin metal layer includes hafnium and is deposited by way of an atomic layer deposition (ALD) process. The thin metal layer 202 may have a thickness of 10 angstroms or less. For example, in this embodiment, the thin metal layer 202 may have a thickness approximately equal to 5 angstroms. The thin metal layer 202 may have other thicknesses in other embodiments.

FIG. 3 illustrates in a simplified cross-sectional view, exemplary semiconductor device 100 at a subsequent stage of manufacture in accordance with an embodiment of the present invention. After thin metal layer 202 is deposited over the germanium oxide layer 104, a metal oxide layer 302 is deposited over the thin metal layer 202. Metal oxide layer 302 includes a metal material the same as metal material of the thin metal layer 202. For example, metal oxide layer 302 may be formed as an aluminum oxide ($Al_2O_3$) layer when deposited over thin metal layer 202 formed as an aluminum layer. In this embodiment, metal oxide layer 302 includes hafnium oxide ($HfO_2$) and is deposited by way of an ALD process. The metal oxide layer 302 may have a thickness of 100 angstroms or less, but may be greater than 100 angstroms in other embodiments. For example, in this embodiment, the metal oxide layer 302 may have a thickness approximately in a range of 20-30 angstroms.

FIG. 4 illustrates in a simplified cross-sectional view, exemplary semiconductor device 100 at a subsequent stage of manufacture in accordance with an embodiment of the present invention. Following the metal oxide layer 302 deposition, a post deposition anneal (PDA) process is used to form a combined metal oxide dielectric layer 402. The PDA process may be performed at temperatures ranging from 300 to 1000 degrees centigrade for time periods ranging from 5 to 100 seconds, for example, and may be performed in the presence of an inert gas (e.g., argon, nitrogen, etc.). During the PDA process, the thin metal layer 202 reacts with the germanium oxide layer 104 and is concurrently combined with the metal oxide layer 302 thus forming the dielectric layer 402. Because the thin metal layer 202 includes a metal similar as the metal included in metal oxide layer 302, when reacted with the germanium oxide layer 104, a metal oxide is formed having a similar composition as the deposited metal oxide layer 302. Thus, the dielectric layer 402 is formed as one singular metal oxide layer. In some embodiments, it may be desirable for the resulting dielectric layer 402 to have a graded composition, for example, having a higher metal concentration at one surface and a lower metal concentration at an opposite surface. Alternatively, in some embodiments it may be desirable for the resulting dielectric layer 402 to have a homogenous composition, for example, having a similar metal concentration across all areas of dielectric layer 402.

In the illustrated embodiment, the dielectric layer 402 includes hafnium oxide ($HfO_2$) and may be characterized as a high-K dielectric layer. For example, during the PDA process, thin metal layer 202 (Hf) reacts with the germanium oxide layer 104 ($GeO_2$) according to the equation $Hf+GeO_2 \rightarrow HfO_2+Ge$ whereby the germanium (Ge) remains at the surface of germanium substrate 102. The hafnium oxide formed from this reaction has a similar composition as the deposited hafnium oxide layer 302 such that the combined dielectric layer 402 is formed as a hafnium oxide ($HfO_2$) single high-K dielectric layer.

The above reaction allows the thin metal layer 202 to combine with the germanium oxide layer 104 forming a metal oxide layer, effectively removing the germanium oxide layer 104. Because the germanium oxide layer 104 is removed in this manner, known wet and/or dry etch techniques to remove germanium oxide, as recognized by skilled artisans, can be omitted in some embodiments, saving cycle time and reducing costs.

In this embodiment, illustrated in FIG. 4, the PDA process is used to form the dielectric layer 402 after the first metal oxide 302 deposition. Alternatively, in some embodiments, a first PDA process may be applied after deposition of the thin metal layer 202 and before the first metal oxide layer 302 deposition (see FIG. 7 description below).

FIG. 5 illustrates in a simplified cross-sectional view, exemplary semiconductor device 100 at a subsequent stage of manufacture in accordance with an embodiment of the present invention. After formation of the dielectric layer 402 illustrated in FIG. 4, a gate material layer is deposited and patterned to form a transistor gate 502. The gate material layer may include any suitable metal material such as tantalum, tantalum nitride, titanium, titanium nitride, tungsten, aluminum, and the like, or any combination thereof. The gate material layer may be deposited to have a thickness of 1000 angstroms or less, and in some embodiments, may have a thickness greater than 1000 angstroms. In some embodiments, a polysilicon layer may be deposited over the gate material layer to assist in the patterning of the gate material layer. In this embodiment, the gate 502 is formed from a titanium nitride material, and is used as a self-aligned mask whereby the dielectric layer 402 can be removed from areas not covered by the gate material layer. The portion of the dielectric layer 402 that remains between the gate 502 and substrate 102 may be referred to as a gate dielectric 504.

FIG. 6 illustrates in a simplified cross-sectional view, exemplary semiconductor device 100 at a subsequent stage of manufacture in accordance with an embodiment of the present invention. Shown in FIG. 6 is formation of a transistor 600 including gate 502, gate dielectric 504, with sidewall spacers 602 and source/drain regions 604. After forming gate 502 illustrated in FIG. 5, sidewall spacers 602 are formed at the sidewalls of gate 502 and sidewalls of exposed portions of gate dielectric 504. Sidewall spaces may be formed from any suitable material such as silicon oxide. In this embodiment, sidewall spacers are formed from a tetraethyl orthosilicate (TEOS) material. After sidewall spacers 602 are formed, transistor source/drain regions 604 are formed by way of ion implantation. In this embodiment, source/drain regions 604 are formed from a self-aligned ion implantation process. In some embodiments, a gate replacement process may be employed whereby polysilicon material formed as gate 502 is removed and replaced with an above-mentioned metal material.

FIGS. 7 and 8 illustrate, in simplified cross-sectional views, stages of manufacture of exemplary semiconductor device 100 formed in accordance with another embodiment of the present disclosure. The stages of manufacture illustrated in FIGS. 7 and 8 depict another embodiment for the stages of manufacture depicted in FIG. 3.

For example, at the stage of manufacture depicted in FIG. 3, metal oxide layer 302 is deposited over thin metal layer 202, and subsequently subjected to an anneal process to form one dielectric layer 402 as depicted in FIG. 4. Alternatively, a first anneal process is performed after the deposition of the thin metal layer 202 (FIG. 2) to form a first metal oxide layer 702 as depicted in the embodiment of FIG. 7. After the first anneal process is performed, a second metal oxide layer 802 is deposited over the formed first metal oxide 702. Second metal oxide layer 802 may be similarly formed as metal oxide layer 302. After second metal oxide layer 802 is deposited, a second anneal process is performed to form one dielectric layer as shown as dielectric layer 402 illustrated in FIG. 4.

FIG. 7 illustrates in a simplified cross-sectional view, exemplary semiconductor device 100 at a stage of manufacture in accordance with an embodiment of the present invention. Here, FIG. 7 depicts another embodiment at a stage of manufacture subsequent to the stage of manufacture illustrated in FIG. 2. In this embodiment, after depositing thin metal layer 202 as illustrated in FIG. 2, a first post deposition anneal (PDA) is used to react the thin metal layer 202 with the germanium oxide ($GeO_x$) layer 104 to form a first metal oxide layer 702.

In the embodiment depicted in FIG. 7, during the first PDA process, thin metal layer 202 (Hf) reacts with the germanium oxide layer 104 ($GeO_2$) to form first metal oxide layer ($HfO_2$) 702 according to the equation $Hf+GeO_2 \rightarrow HfO_2+Ge$ whereby the germanium (Ge) portion remains at the surface of germanium substrate 102. In this embodiment, thin metal layer 202 effectively consumes the germanium oxide layer while forming the first metal oxide layer 702.

FIG. 8 illustrates in a simplified cross-sectional view, exemplary semiconductor device 100 at a subsequent stage of manufacture in accordance with an embodiment of the present invention. After forming first metal oxide layer 702 to effectively remove germanium oxide layer 104, a second metal oxide layer 802 is deposited over the first metal oxide layer 702. Here, the second metal oxide layer 802 may be similar to the first metal oxide layer 302 as depicted in FIG. 3. Second metal oxide layer 802 includes a metal material the same as metal material of the first metal oxide layer 702. In this embodiment, second metal oxide layer 802 includes hafnium oxide ($HfO_2$) and is deposited by way of an ALD process. The first metal oxide layer 702 may have a thickness of 20 angstroms or less, and second metal oxide layer may have a thickness of 100 angstroms or less, but each may have other thicknesses in other embodiments. For example, in this embodiment, the first metal oxide layer 702 may have a thickness approximately in a range of 5-10 angstroms, and second metal oxide layer may have a thickness approximately in a range of 20-30 angstroms.

After deposition of the second metal oxide layer 802, subsequent stages of manufacture for semiconductor device 100 continue as depicted in FIGS. 4-6. For example, after deposition of the second metal oxide layer 802, a second PDA process is used to form the combined metal oxide dielectric layer 402 depicted in FIG. 4. In this embodiment, dielectric layer 402 is formed from first and second metal oxide layers 702 and 802 during the second PDA process. In this embodiment, the dielectric layer 402 includes hafnium oxide ($HfO_2$) and may be characterized as a high-K dielectric layer 402. In FIG. 5, gate material layer is deposited and patterned to form a transistor gate 502 and gate dielectric 504. And in FIG. 6, transistor 600 is formed including gate 502, gate dielectric 504, sidewall spacers 602, and source/drain regions 604.

In yet another embodiment, layer 802 may be a deposited metal layer instead of a second metal oxide layer as described above. Here, a second metal layer 802 is deposited over first metal oxide layer 702. Second metal layer 802 includes a metal material the same as metal material of the first metal oxide layer 702. In this embodiment, first metal oxide layer 702 is formed as an aluminum oxide (e.g., $Al_2O_3$). Second metal layer 802 includes an aluminum (Al) material and may be deposited by way of a chemical vapor deposition (CVD) or metal-organic CVD process. In this embodiment, second metal layer 802 has a thickness greater than the thickness of the thin metal layer 202. Second metal layer 802 may have a thickness as high as of 2 microns. In this embodiment, semiconductor device 100 may be formed as a micro-electro-mechanical systems (MEMS) device, or other circuit device, for example.

FIG. 9 illustrates in a simplified cross-sectional view, an exemplary sensor device 900 at a stage of manufacture formed in accordance with an embodiment of the present invention. Sensor device 900 includes an exemplary second semiconductor device 910 formed as cap die and affixed to semiconductor device 100 formed as a MEMS device. Topside or active surfaces of semiconductor device 910 and MEMS device 100 are affixed to one another at interface 908. Semiconductor device 910 may include analog circuitry, digital circuitry, one or more amplifiers, registers, counters, buffers, interfaces, passive elements, and the like, or any combination of circuitry and functions, for example. MEMS device 100 may be used for detecting and/or measuring motion, pressure, acceleration, and the like, for example.

In this embodiment, semiconductor device 910 includes a substrate 902, through-silicon-vias (TSVs) 904, and TSV interface layer 906. TSVs 904 may be formed from a variety of electrically conductive materials including, for example, polysilicon, copper, gold, silver, aluminum, nickel, tungsten, and combinations thereof. Similarly, TSV interface layer 906 may be formed from a variety of electrically conductive materials including, for example, copper, gold, silver, aluminum, nickel, tungsten, and alloys thereof. In this embodiment, TSV interface layer 906 is formed from an aluminum material. Surfaces of TSV interface layer 906 of semiconductor device 910 and second metal layer 802 of MEMS device 100 may be affixed to one another by way of thermo-compression or eutectic bonding techniques, for example, to form an electrical connection and a mechanical adhesion.

Generally, there is provided, a method including depositing a first metal layer over an oxide layer, the oxide layer formed at a top surface of a germanium substrate; depositing a first metal oxide layer over the first metal layer, the first metal oxide layer including a same metal material as the first metal layer; and during a first anneal process, combining the first metal layer with the oxide layer and the first metal oxide layer to form a dielectric layer. The oxide layer may be reacted with the first metal layer to remove the oxide layer during the first anneal process. The first metal layer may be deposited by way of an atomic layer deposition (ALD) process. The first metal layer may have a thickness of 10 angstroms or less. The method may further include depositing a gate material layer over the dielectric layer, and patterning the gate material layer to form a transistor gate and gate dielectric, the gate dielectric including a portion of the dielectric layer. The gate material may include a titanium material. The first metal layer may include a hafnium (Hf) material and the first metal oxide layer may include a hafnium material. The first metal oxide layer may have a thickness of 100 angstroms or less. The oxide layer formed at a top surface of a germanium substrate may be characterized as a germanium oxide (GeOX) layer.

In another embodiment, there is provided, a method including depositing a metal layer over a germanium oxide (GeOX) layer, the germanium oxide layer formed at a top surface of a germanium substrate; during a first anneal process, combining the metal layer and the germanium oxide layer to form a first metal oxide layer; depositing a second metal oxide layer over the first metal oxide layer, the second metal oxide layer including a same metal material as the first metal oxide layer; and during a second anneal process, forming a high-K dielectric layer from the first metal oxide layer and the second metal oxide layer. The germanium oxide layer may no longer remains after the first anneal process. The metal layer and the second metal oxide layer may each include a hafnium (Hf) material. The method may further include depositing a gate material layer over the high-K dielectric layer; patterning the gate material layer to form a transistor gate and high-K gate dielectric, the high-K gate dielectric including a portion of the high-K dielectric layer; and forming a metal-gate transistor including the transistor gate and high-K gate dielectric. The metal layer may be deposited by way of an atomic layer deposition (ALD) process. The metal layer may have a thickness of 10 angstroms or less. The second metal oxide layer may have a thickness of 100 angstroms or less.

In yet another embodiment, there is provided, a method including depositing a first metal layer over a germanium oxide (GeOX) layer, the germanium oxide layer formed at a top surface of a germanium substrate; during a first anneal process, combining the first metal layer and the germanium oxide layer to form a first metal oxide layer; and depositing a second metal layer over the first metal oxide layer, the second metal layer including a same metal material as the first metal layer. The first metal layer and the second metal layer may each include an aluminum (Al) material. The first metal layer may have a thickness of 10 angstroms or less. The method may further include affixing a cap die at a topside surface of the second metal layer to form a sensor device.

By now it should be appreciated that there has been provided, a method of forming a structure on a germanium (Ge) substrate to remove a germanium oxide layer. By depositing a thin metal layer over a germanium oxide layer at a top surface of a germanium substrate followed by an anneal process, a metal oxide can be formed during the anneal process. The metal oxide formation effectively removes the germanium oxide layer and provides a quality interface layer at the surface of the germanium substrate. With the formation of the metal oxide, a subsequent deposition of a like metal oxide can be used to form a high-K dielectric. Likewise, after formation of the metal oxide, a subsequent deposition of a like metal can be used to form an adhesion layer at a die-on-die interface.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
   depositing a first metal layer directly on a native germanium oxide layer at a top surface of a germanium substrate;
   during a first anneal process, forming a metal oxide layer by way of combining the first metal layer with the native germanium oxide layer;
   depositing a second metal layer over the metal oxide layer; and
   during a second anneal process, forming a dielectric layer by way of combining the first metal layer with the second metal layer.

2. The method of claim 1, wherein in forming the metal oxide layer the native germanium oxide layer is reacted with the metal layer to remove the native germanium oxide layer during the first anneal process.

3. The method of claim 1, wherein the first metal layer is deposited by way of an atomic layer deposition (ALD) process.

4. The method of claim 3, wherein the first metal layer has a thickness of 10 angstroms or less.

5. The method of claim 1, further comprising depositing a gate material layer over the dielectric layer, and patterning the gate material layer to form a transistor gate and gate dielectric, the gate dielectric comprising a portion of the dielectric layer.

6. The method of claim 5, wherein the gate material comprises a titanium material.

7. The method of claim 1, wherein the first metal layer comprises a hafnium (Hf) material and the metal oxide layer comprises a hafnium material.

8. The method of claim 3, wherein the first metal oxide layer has a thickness of 100 angstroms or less.

9. The method of claim 1, wherein the native germanium oxide layer at the top surface of the germanium substrate is formed from exposing the germanium substrate to air.

10. A method comprising:
    depositing a first metal layer directly on a native germanium oxide ($GeO_x$) layer at a top surface of a germanium substrate;
    during a first anneal process, forming a metal oxide layer by way of combining the metal layer and the native germanium oxide layer;
    depositing a second metal layer over the metal oxide layer, the second metal oxide layer comprising a same metal material as the metal oxide layer; and
    during a second anneal process, forming a high-K dielectric layer from the metal oxide layer and the second metal layer.

11. The method of claim 10, wherein the native germanium oxide layer no longer remains after the first anneal process.

12. The method of claim 10, wherein the first metal layer and the metal oxide layer each comprise a hafnium (Hf) material.

13. The method of claim 10, further comprising:
    depositing a gate material layer over the high-K dielectric layer;
    patterning the gate material layer to form a transistor gate and high-K gate dielectric, the high-K gate dielectric comprising a portion of the high-K dielectric layer; and
    forming a metal-gate transistor comprising the transistor gate and high-K gate dielectric.

14. The method of claim 10, wherein the first metal layer is deposited by way of an atomic layer deposition (ALO) process.

15. The method of claim 10, wherein the first metal layer has a thickness of 10 angstroms or less.

16. The method of claim 10, wherein the oxide layer has a thickness of 100 angstroms or less.

17. The method of claim 10, wherein the first metal layer is deposited by way of an atomic layer deposition (ALD) process.

18. The method of claim 13, wherein the gate material comprises a titanium material.

19. The method of claim 10, wherein the native germanium oxide layer at the top surface of the germanium substrate is formed from exposing the germanium substrate to air.

* * * * *